United States Patent [19]

Guanella

[11] 4,137,505
[45] Jan. 30, 1979

[54] METHOD OF AND APPARATUS FOR FREQUENCY CONTROL

[75] Inventor: Gustav Guanella, Zurich, Switzerland

[73] Assignee: Patelhold Patentverwertungs- & Holding AG, Glaurus, Switzerland

[21] Appl. No.: 674,890

[22] Filed: Apr. 8, 1976

[30] Foreign Application Priority Data

Apr. 16, 1975 [CH] Switzerland .................. 4818/75

[51] Int. Cl.² ............................................. H03D 3/06
[52] U.S. Cl. ....................................... 329/124; 331/12
[58] Field of Search .................. 331/12; 329/124, 125

[56] References Cited

U.S. PATENT DOCUMENTS

| | | | |
|---|---|---|---|
| 2,481,659 | 9/1949 | Guanella | 331/12 |
| 2,522,371 | 9/1950 | Guanella et al. | 331/12 |
| 3,638,125 | 1/1972 | Goell | 329/124 |
| 3,748,590 | 7/1973 | Gray | 331/12 |
| 3,789,316 | 1/1974 | Goetz et al. | 329/124 |

Primary Examiner—John Kominski
Attorney, Agent, or Firm—Orville N. Greene; Frank L. Durr

[57] ABSTRACT

Method and apparatus for demodulation of a phase shift keyed carrier in which a plurality of auxiliary signal frequency sources are provided and a substantially constant phase difference is maintained therebetween. Each auxiliary signal frequency is mixed with the modulated carrier and the mixer outputs are combined to form the product thereof to yield a control signal for regulating the auxiliary.

The sum and differences of the mixer output may be formed prior to forming the product thereof.

Input signals to the product forming circuit are amplitude limited to limit variation of the control signal r between $-1 \leq r \leq +1$.

A filter may be employed to smooth the control voltage and may be incorporated with switching means to periodically interrupt the control signal to limit evaluation only during the established keying phase.

34 Claims, 27 Drawing Figures

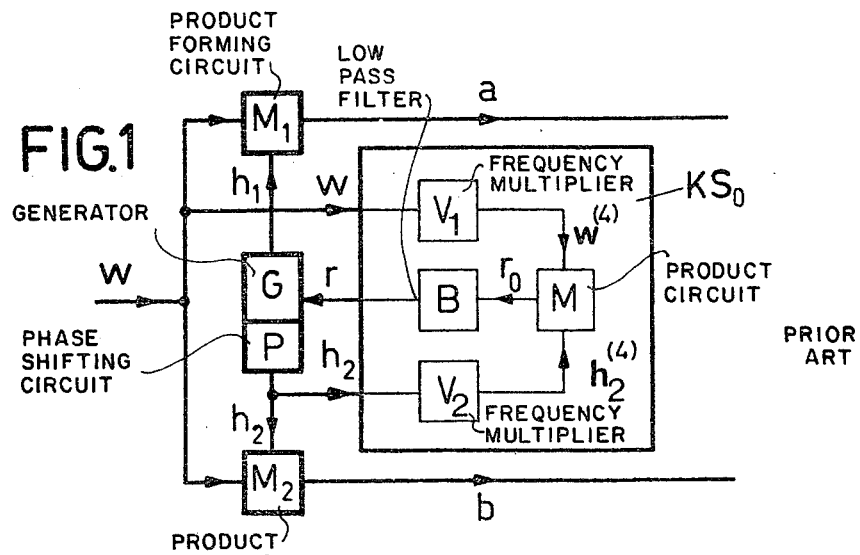
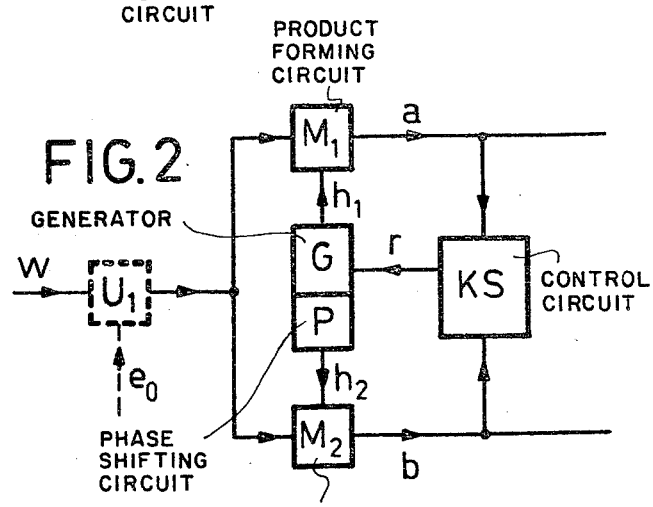
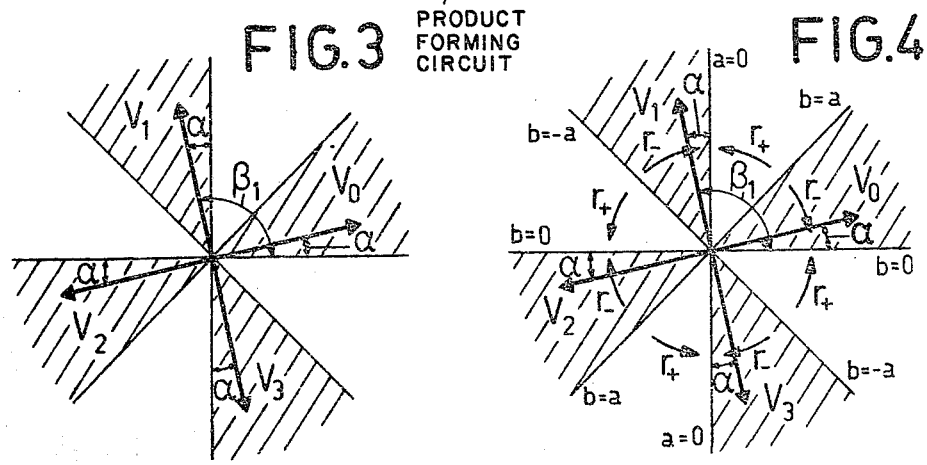

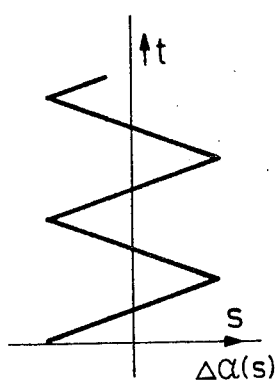 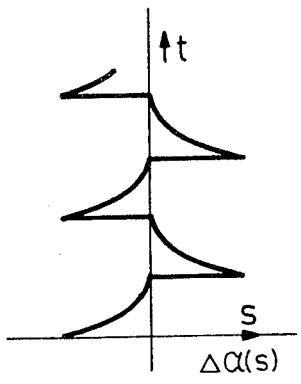 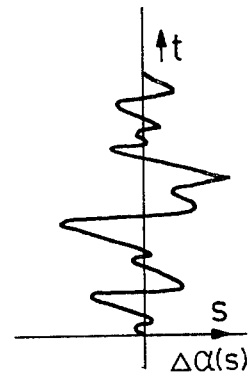
FIG.15a                FIG.16a                FIG.17a
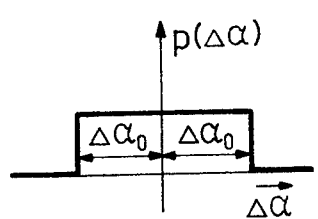 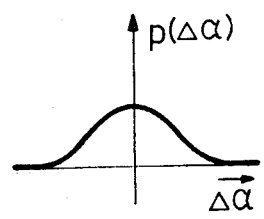 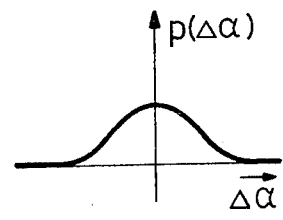
FIG.15b                FIG.16b                FIG.17b
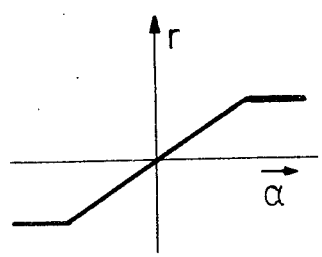 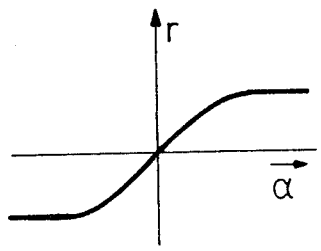 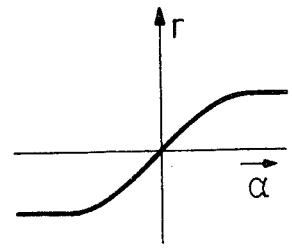
FIG.15c                FIG.16c                FIG.17c

METHOD OF AND APPARATUS FOR FREQUENCY CONTROL

BACKGROUND OF THE INVENTION

The invention relates to a method of and an apparatus for controlling the frequency of at least two auxiliary signal frequencies with constant phase difference therebetween for the demodulation of a phase-keyed high-frequency signal.

In the transmission of information by the phase keying of a high-frequency carrier, the phase of the carrier is altered at equal time intervals by integral multiples of a definite phase angle corresponding to the data signals to be transmitted. For demodulation at the receiver of the transmitted high frequency signal or of a signal of lower frequency derived therefrom by frequency conversion, signals are derived which correspond at all times to the mean product of the transmitted signal and at least one auxiliary signal of constant frequency. In this synchronous demodulation, the frequency of the auxiliary signal must, by automatic regulation, be held continuously in agreement with the frequency of the signal to be demodulated when in the unchanged keying condition. The control voltage necessary for frequency control of the auxiliary signal must however be generated even with changing keying and it should be independent of the instantaneous keying condition.

Such a regulating voltage may be derived by frequency multiplication of the signal to be demodulated and an auxiliary signal and formation of the mean product of the two signals of higher frequency. Alternatively, a frequency multiplication and subsequent frequency division of the signal to be demodulated is also possible to obtain a carrier with suppressed phase modulation, of which the phase is then compared with the phase of an auxiliary signal to produce a control voltage. A considerable disadvantage of such methods results from the additional expense of this multiplication and the filtering made necessary by the use of this technique. With fast keying the transient delays of the filters employed may also operate deleteriously.

OBJECT AND BRIEF DESCRIPTION OF THE INVENTION

The object of the invention is to avoid the disadvantages of such known methods. This is achieved by generating a control magnitude signal for controlling the frequency of the auxiliary signal by forming the product of signals which result through superposition of the auxiliary signal upon the high frequency signal to be modulated.

BRIEF DESCRIPTION OF THE FIGURES

The process according to the invention and corresponding arrangements will now be explained with reference to the accompanying drawings in which:

FIG. 1 is a block diagram of a known control circuit for a generator of auxiliary signals for controlling a demodulator for phase-keyed signals;

FIG. 2 is a block diagram of an embodiment of the invention;

FIGS. 3–5 are vector diagrams useful in describing the invention;

FIGS. 15a–c, 16a–c and 17a–c illustrate alternative modes of operation of an embodiment of the invention;

DETAILED DESCRIPTION OF THE INVENTION INCLUDING PREFERRED EMBODIMENTS THEREOF

Figure 5:
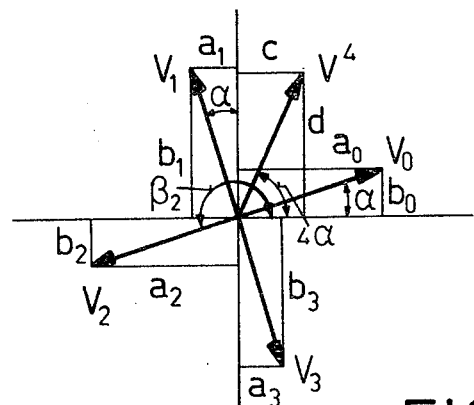

The signal w to be demodulated, has an amplitude W and a circular frequency $W_o$ and corresponds to the expression $$w = W \sin (W_o t + 2\pi \frac{k}{n}) \qquad (1)$$

Here the number of possible keying conditions is denoted by n and the number of the actual keyed condition by k. In the embodiments of FIGS. 1–12 it is assumed that n equals 4 and keying between four different phases, i.e., $\phi = 0, \pi/2, \pi, 3\pi/2$. Thus $$w = W \sin (W_o t + y) = W \sin (W_o T + k \frac{\pi}{2}) \qquad (2)$$

$$(k = 0, 1, 2, 3)$$

In the arrangement of FIG. 1, demodulation of the phase-keyed high frequency signal w is effected by forming the modulation product of signal w and the auxiliary signals $h_1$, $h_2$ in the product forming circuits $M_1$ and $M_2$. These auxiliary signals have constant amplitudes H and a phase deviation $\alpha$, to be kept as small as possible, with respect to a particular keying phase of the high frequency signal w, and they are mutually phase displaced by $\pi/2$:

$$h_1 = H \sin (W_o t - \alpha) \qquad (3)$$

$$h_2 = H \cos (W_o t - \alpha) \qquad (4)$$

The modulation products a and b are freed from higher frequency components $a_h$ and $b_h$ by low-pass filters provided in $M_1$ and $M_2$; i.e., we have $$a = w_1 - a_h = \cos (k \frac{\pi}{2} + \alpha) \qquad (5)$$

$$b = w_2 - b_h = \sin (k \frac{\pi}{2} + \alpha) \qquad (6)$$

where $w_1 = h_1 w$ and $w_2 = h_2 w$

The instantaneous keying condition and thus the data signals to be transmitted are derivable forthwith from a and b: neglecting the small deviation $\alpha$ we have Table I

| k | a | b |
|---|----|---|
| 0 | 1 | 0 |
| 1 | 0 | 1 |
| 2 | −1 | 0 |

Table I-continued

| k | a | b |
|---|---|---|
| 3 | 0 | −1 |

The auxiliary signals $h_1$, $h_2$ are generated in generator G. An additional phase shift of $h_2$ through $\pi/2$ is effected in phase shifting circuit P. Extended synchronism with particular keying conditions of the high frequency signal w is ensured by frequency control of the generator G by a control voltage R. In one known construction (FIG. 1) of control circuit $KS_0$, control voltage, r is obtained by multiplication of signals $h_2$ and w. In this known circuit, two signals, $h_2^{(4)}$ and $w^{(4)}$ are generated in $V_2$ and $V_1$, respectively. These signals are applied to a product circuit M which produces product signal $r_o$. Signal $r_0$ is then passed through a low-pass filter B resulting in control signal r.

$$r_o = -w^{(4)} h_2^{(4)} = -\sin(4w_o t + 2k\pi) \cdot \cos(4w_o t - 4\pi) \quad (7)$$

$$r = -\sin(2k\pi + 4\alpha) = -\sin(4\alpha) \approx -4\alpha \quad (8)$$

To avoid the disadvantages of the control circuit $KS_o$ indicated in FIG. 1, there will now be employed in accordance with the invention a control circuit KS which no longer evaluates the high frequency signals w and h, but the signals a and b derived therefrom by demodulation, as is indicated in FIG. 2. The evaluation is then effected by product formation, as is again shown with reference to FIGS. 6, 7, 8, 11, 13.

The signals a, b may be regarded as components of a vector $V_k$, which is shown in FIG. 3 for the four keying conditions, taking into account the small phase errors $\alpha$, which act on the components in accordance with equations (5) and (6). To ensure unambiguous discrimination of these vectors the phase error should at no time exceed the range $-\pi/4 < \alpha < \pi/4$ and the automatic regulation should always have the effect that a vector in the shaded region experiences a rotation to the right (i.e., clockwise) and in the unshaded region a rotation to the left (counterclockwise). This is indicated by arrows in FIG. 4 and is brought about by positive or negative frequency control voltages $r_+$ and $r_-$. The control voltage to be obtained should now depend upon the instantaneous phase error $\alpha$, but not upon the keying condition; it should thus prove to be of the same magnitude in the four possible positions of the vector $V_k$. In accordance with a preferred embodiment of the invention there is obtained from the vector $V_k$ after regulation of the vector involution a new vector $V^n$. The exponent n again corresponds to the number of possible keying conditions. Thus in the example being considered, $n = 4$. On the assumption that the amplitude of the original keying vector $V_k$ is 1, we have:

$$V_k = e^{j\beta_k} = e^{j(2\pi\frac{k}{n} + \alpha)} = a_k + jb_k \quad (9)$$

$$V_k^n = V_k^4 = e^{j\mu\beta_k} = e^{j(2\pi k + 4\alpha)} = e^{j4\alpha} \quad (10)$$

The exponent $4\alpha$ is now free from k; that is, the resultant vector is now independent of the keying condition and the four possible keying vectors $V_0, \ldots V_3$ yield after involution the same vector $V^4$, as may be seen from FIG. 5, in which are also represented the components $a_k$, $b_k$ of the keying vectors $V_k$. The involution yields:

$$V^4 = e^{j4\alpha} = (a_k + jb_k)^4 (a_k + jb_k)^4 = a_k^4 + 4ja_k^3 b_k - 6a_k^2 b_k^2 - 4ja_k b_k^3 + b_k^4 = c + jd \quad (11)$$

$$d = \sin 4\alpha = 4a_k^3 b_k - 4a_k b_k^3 \quad (12)$$

From $d = \sin 4\alpha$ there is immediately obtained a control magnitude r suitable for correction of the phase error:

$$r = -\frac{d}{4} = \frac{-\sin 4\alpha}{4} = \quad (13)$$

$$a_k b_k^3 - a_k^3 b_k = a_k b_k (b_k^2 - a_k^2) \approx -\alpha$$

The control signal is thus proportional to small errors $\alpha$ in the phase angle. For arbitrarily varying phase deviation the variation is to be seen from FIG. 9 from which it is apparent that at the set positions of the keying vectors at $k = 0; 1; 2; 3$ or at $\beta = 0; \pi/4; \pi/2; 3\pi/4$ the control magnitude signal r each time vanishes, while for small deviations with respect to the set position a frequency alteration correcting the deviation is effected.

Figure 6:
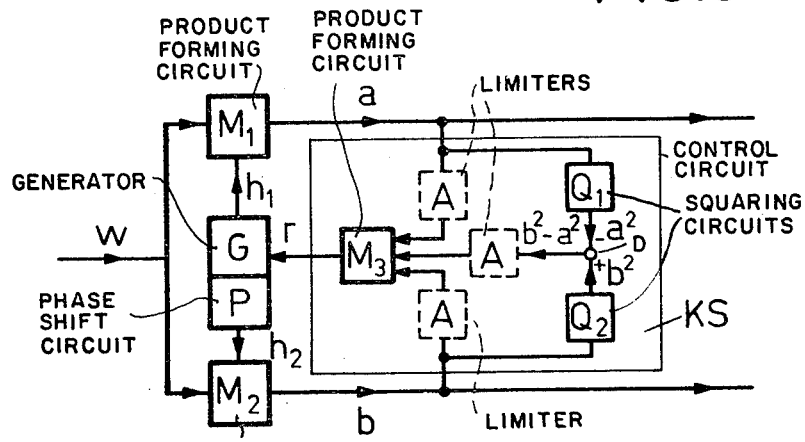
FIGS. 6–8 are block diagrams of further embodiments of the invention.

A circuit for carrying out this frequency control is shown in FIG. 6. The control circuit KS contains two squaring circuits Q1, Q2, which for example by nonlinear transformation, form from a and b the values $a^2$ and $b^2$, of which the difference (developed by difference circuit D) is applied to the product circuit $M_3$. In $M_3$ is formed the product $r = ab(b^2 - a^2)$, which corresponds to the relation (13) and is applied as a frequency control signal to the generator G. A possible extension of the circuit by the additional elements A is dealt with below, while the remaining parts of the circuit and their function has already been explained with reference to FIGS. 1 and 2.

The relation (13) may be replaced by $$r = -\frac{d}{4} = a_k b_k (b_k + a_k)(b_k - a_k) \quad (14)$$

Figure 7:
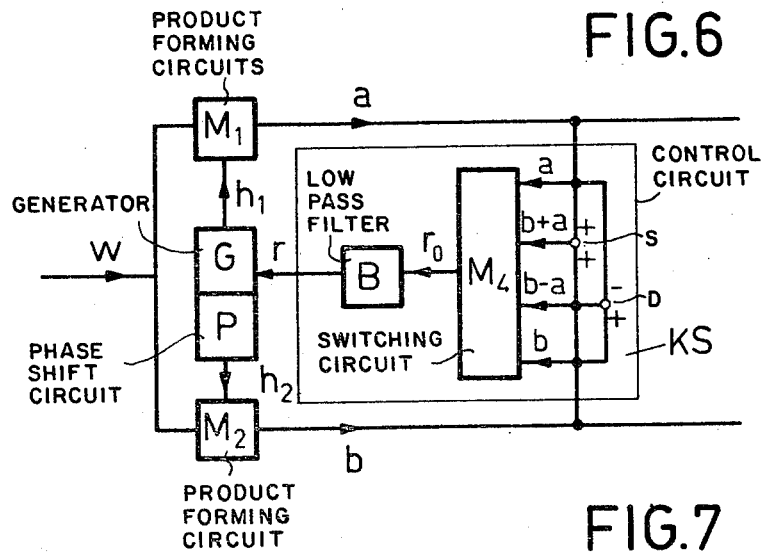

In accordance with FIG. 7 a control circuit KS may then also contain a switching circuit $M_4$ that forms the product of a, b, (b + a) through the employment of sum circuit S and difference circuit D. Through additional smoothing of the product $r_o$ the control signal r thus obtained may be substantially freed from all deviations due to brief interference.

With amplitude limitation of the factors appearing in equations (13) or (14) the product signal r varies only between the values $+1$ and $-1$:

$$r = a_k^* b_k^* (b_k^2 - a_k^2)^* = -(\sin 4\alpha)^* = \pm 1 \quad (15)$$

$$r = a_k^* b_k^* (b_k + a_k)^* (b_k - a_k)^* = -(\sin 4\alpha) = \pm 1 \quad (16)$$

The limiting is here denoted by the sign *. The sign of the control signal is thus always opposite to the sign of the small phase error; i.e. the regulation always operates in the sense of a reduction of this error. For arbitrary phase differences $\beta$ there results a variation of the control magnitude in accordance with FIG. 10, and the phase angle $\beta = 0; \pi/2; \pi; 3\pi/2$ is thus produced, in accordance with the keying condition.

A corresponding modification of the control circuit KS of FIG. 6 is brought about by the limiters A, which in accordance with the signs of the input signals a, b and $(b^2 - a^2)$ yield an output signal $+1$ or $-1$. The product circuit $M_3$ may then be replaced by a correspondingly simplified circuit, of which the output signal likewise amounts to =1 or −1 in accordance with the product of the signs of the input signals. The control circuit KS may thus be realized with very simple devices available as known logic circuit elements.

The corresponding modification of the control circuit KS in accordance with FIG. 7 leads to the circuit of FIG. 8, which again contains limiters A, the constant-amplitude output signals of which exhibit the same signs as the input signals. The product circuit $M_4$ (FIG. 7) is here replaced by the circuit N, of which the output signal $r_o$ assumes the value +1 or −1 in accordance with the product of the signs of the input signals. The purpose and operation of a possible auxiliary signal s is again explained further below.

Figure 8:
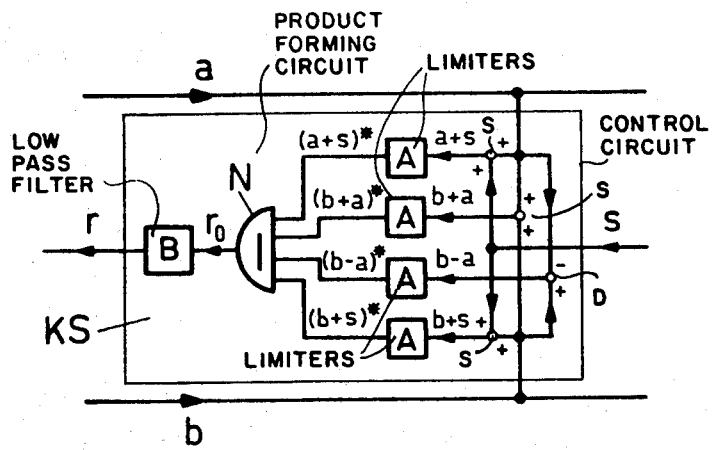
Figure 9:
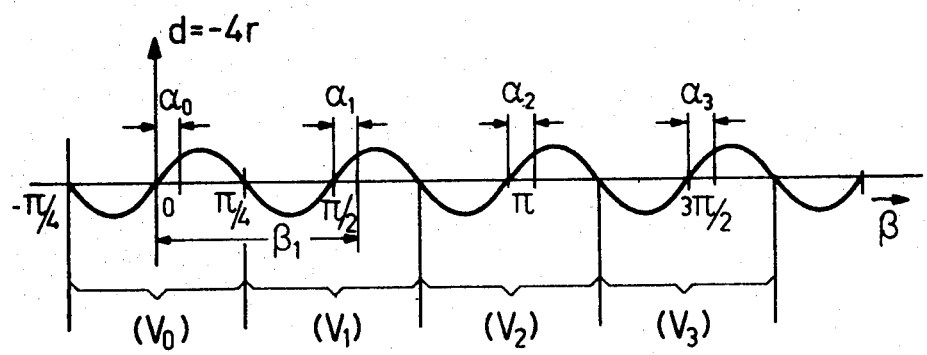
FIGS. 9 and 10 are waveform diagrams illustrating embodiments of the invention.
Figure 10:
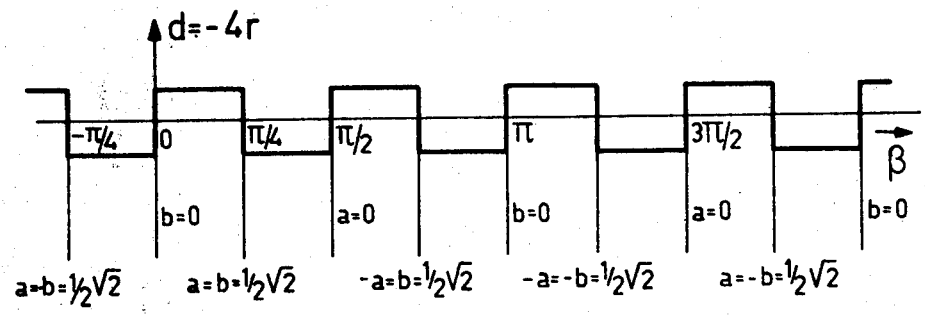

In FIG. 9 it is apparent that the control signal d is obtained without limiting in accordance with FIG. 6 or 7, while a control signal in accordance with FIG. 10 results from the use of limiting in accordance with either FIG. 6 (with circuits A) or FIG. 8. The control signal vanishes at the zero crossings, and initial phase errors are corrected in the positive or negative sense until the phasing $\beta = 0; \pi/2; \pi; 3\pi/2$ is attained. This condition is attained at any time for b = 0 or a = 0. Further zero crossings occur, it is true, also for b = +a. This however deals with an unstable condition, since a small deviation at any time is increased by the control until one of the mentioned stable zero-crossings is reached, as is apparent from the arcuate arrows in FIG. 4.

The high frequency carrier to be demodulated can, it is true, also be phase keyed in the manner that for the 4 keying conditions, after regulation has been effected, the keying signals in accordance with Table II will appear:

Table II

| k | a | b |
|---|---|---|
| 0 | 1 | 1 |
| 1 | −1 | 1 |
| 2 | −1 | −1 |
| 3 | 1 | −1 |

Thus in these cases after reaching the synchronous condition for vanishing $\alpha$ the keying vectors are rotated through $\pi/4$ as compared with FIG. 3 and FIG. 4. The zero crossings in FIGS. 9 and 10 formerly designated as unstable will now also correspond to the stable conditions, while the zero crossings at a = 0 and b = 0 become unstable. This relation may be attained simply by inverting the control signal r, since the arcuate arrows shown in FIG. 4 then reverse their directions.

The methods of vector involution explained with reference to equations (9) to (13) may naturally also be carried out for larger numbers of possible keying conditions and correspondingly larger values of n. On the assumption of n = 6 keying steps the following keying vectors result:

$$V_k = e^{j\beta_k} = e^{j(\frac{\pi}{3}k + \alpha)} \quad (17)$$

and the involved vector becomes $$V^6 = e^{j6\alpha} = (a+jb)^6 =$$
$$a^6 + j6a^5b - 15a^4b^2 - j20a^3b^3 + 15a^2b^4 + j6ab^5 - b^6 \quad (18)$$

From the imaginary term there results:

$$d = \sin 6\alpha = 6a^5b - 20a^3b^3 + 6ab^5 = 2\underbrace{b}_{1}\underbrace{a}_{2}\underbrace{(b - \sqrt{3}\,a)}_{3} \quad (19)$$

$$\underbrace{(\sqrt{3}\,b - a)}_{4}\underbrace{(b + \sqrt{3}\,a)}_{5}\underbrace{(\sqrt{3}\,b + a)}_{6}$$

These products have null points if one of the factors designated with 1, 2, ... 6 becomes zero. There are thus the following stable null conditions:

Table III

| 1: | b = 0 | $\beta = 0; \pi$ |
|---|---|---|
| 3: | b = $\sqrt{3}\,a$ | $\beta = \pi/3; 4\pi/3$ |
| 5: | b = −$\sqrt{3}\,a$ | $\beta = 2\pi/3; 5\pi/3$ |

Between these lie the unstable null points:

Table IV

| 2: | a = 0 | $\beta = \pi/2; 3\pi/2$ |
|---|---|---|
| 4: | a = −$\sqrt{3}\,b$ | $\beta = \pi/6; 7\pi/6$ |
| 6: | a = $\sqrt{3}\,b$ | $\beta = 5\pi/6; 11\pi/6$ |

By inversion of the control signals, derived from d the null points 2, 4, 6 become stable, while points 1, 3, 5 now behave unstably. Thus effective synchronization is attained in cases of phase keying of a high frequency carrier rotated through $\pi/6$.

To carry out this synchronization there are accordingly first of all necessary auxiliary circuits which in a simple manner generate the factors (b ± $\sqrt{3}$a) and (a ± $\sqrt{3}$b) by sum and difference formation. The factors apparent from (19) are next multiplied by means of a product forming circuit $M_3$ or $M_4$ in FIG. 3 or FIG. 4 to obtain the control signals. Naturally here also, in a manner analogous to FIG. 8 a limiting of the individual factors may be provided, which simplifies the product formation.

In accordance with the same methods of vector involution there results for n = 8, i.e., for 8 possible keying conditions, the product $$d = 8ab\,(a^6 - 7a^4b^2 + 7a^2b^4 - b^6) = 8ab\,(b + a)(b - a)(b + 0,414a)\,(b - 0,414a)(b + 2,414a)\cdot(b - 2,414a) \quad (20)$$

while the control signal r = −d/8 derived from d has stable null points at the phase angles $\beta = 0; \pi/4, \pi/2, 3\pi/4, \pi, 5\pi/4, 3\pi/2, 7\pi/4$.

The factors (b + a) as well as (b − a) appearing in (14) and in the circuits FIGS. 7 and 8 yield null points of the control voltage at (b = ± a). In the vectorial representation shown in FIG. 4 the respective vectors are phase rotated by ± $\pi/4$ with respect to the normal positions (b = 0 and a = 0).

Thus corresponding vectors also result through additional modulation of the high frequency signal w with further auxiliary signals which exhibit an additional phase rotation of $\pi/4$ with respect to $h_1$ and $h_2$. This method is employed in the synchronizing circuit of FIG. 11. From the auxiliary signal h of the generator G there are generated in the phase rotating circuit $P_4$ the auxiliary signals $h_{11}, \ldots, h_{14}$, that are applied to the product forming modulators $M_{11}, \ldots, M_{14}$. These auxiliary signals, the phase angle of each of which is shifted by $\pi/4$, are represented in the vector diagram of FIG. 12 by the vectors $H_1, \ldots, H_4$. By limiting the demodulation signals $a_{11}, \ldots, a_{14}$ with the limiters A there result the signals $a_{11}^*, \ldots, a_{14}^*$, which at constant amplitude vary in sign with $a_{11}, \ldots, a_{14}$. By forming the products of the signs in $N_4$ there results therefrom the signal $r_0$, which is relied on for the equalization of brief disturbances in low-pass filter B. The resultant control signal r, which controls the frequency of the generator G, is negative in the position of the vector W shown in FIG. 12, which shows the high frequency oscillation to be demodulated; since the products $a_{12}, a_{13}, a_{11}$ of w with $h_{12}, h_{13}, h_{14}$ are negative while the product of w with $h_{11}$ proves to be positive. This is confirmed from FIG. 12, where $(W.H_2)$, $(W.H_3)$, $(W.H_4)$ are negative while $(W.H_1)$ is positive. For other phases of the high frequency signal w there result partly also positive control magnitudes, and finally, in accordance with the position of the vector W in FIG. 12, the positive or negative control signals $r_+$ or $r_-$ are obtained, which accordingly control the superposition auxiliary signal in the sense of a diminution of initial phase error. The operation of the circuit thus again corresponds to FIG. 10 while by abandoning amplitude limitation in A and employing analog multiplication in $N_4$ a variation of the control voltage in accordance with FIG. 9 would be obtainable.

Figure 13:
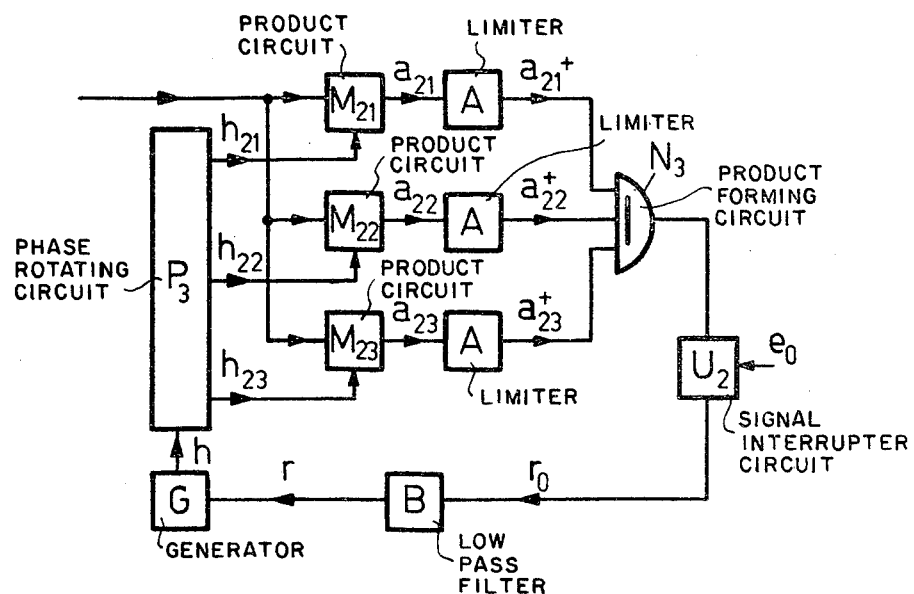
FIG. 13 is a block diagram of another embodiment of the invention.
Figure 14:
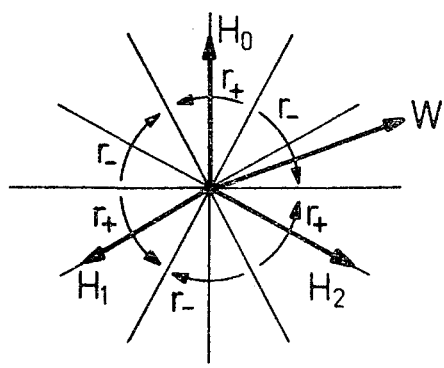
FIG. 14 is a vector diagram illustrating the operation of FIG. 13.

These methods also may be carried out for other numbers of keying conditions. In FIG. 13 is shown a circuit which is based upon a gradation of the high frequency phase into three phase steps. The function and designations of the circuit correspond to those explained with reference to FIG. 11. The three auxiliary signals $h_{21}, h_{22}, h_{23}$ are however mutually phase shifted by $2\pi/3$. In conformity with the vector diagram of FIG. 14 the vector plane is divided into 3 angular ranges each of $\pi/3$, which respectively yield positive or negative signs of the control signal r.

The application of the method is also possible with a modulation of the high frequency signal with only two keying conditions (n = 2), which differ by a phase difference of $\pi$. In this case an arrangement in accordance with FIG. 11 suffices, with omission of the product circuits $M_{12}$ and $M_{14}$. The output signals $a_{11}$ and $a_{13}$ of $M_{11}$ and $M_{13}$ there correspond to the signals a of equation (5) and −b of equation (6) and because n = 2 their analog product yields a control signal $$r = a_{11} a_{13} = -\frac{\sin(2\alpha)}{2} \tag{21}$$

By limiting $a_{11}$ and $a_{13}$ in A and formation of the product of the signs of the limited signals $a_{11}^*$ and $a_{13}^*$ in $N_4$ there results on the other hand a control signal $r^* = \pm 1$, the sign of which corresponds with the sign of r.

The alteration of the phasing between the evaluated keying conditions appearing upon phase keying is in many cases limited to negligibly short time intervals. However, this is by no means always the case. To obtain as small as possible a bandwidth of the transmitted signals, particularly with fast keying, the phase is periodically continuously varied, so that the phasing characteristic of the individual keying conditions is present at any time only in periodically repetitive brief intervals. Even in such cases the above-described arrangements yield useful signals, as appropriate investigations have shown; both with the analog solution (with formation of the analog products) and also with the digital solution (with formation of the product of the signs) there result in such cases control signals that — apart from an amplitude reduced by a constant factor — have substantially the same variation as in the cases of a negligibly small duration of the phase alteration between the evaluated keying conditions ("hard" keying). If however the keying frequency is known, then in cases of a continuous, non abrupt phase alteration ("soft" keying) a periodic interruption is advantageously provided, so that the evaluation is effective only during the established keying phase. The received high frequency signal may then be interrupted by the timing signal in rhythm with the phase keying, so that it is superimposed with the auxiliary signal only in the relatively short time intervals in which the phases to be evaluated are present. For this, for example, an interrupter $U_1$ shown in broken line in FIG. 2 is suitable, that is closed by the periodically appearing brief impulses of the clock generator signal $e_0$. A correspondingly controlled interrupter $U_2$ may also be connected, e.g. in even series with the smoothing circuit B, as in FIG. 13, so that at any time only the instantaneous values of the control signal $r_0$ corresponding with the phases to be evaluated are transmitted. Finally a temporary interruption of the evaluation may be provided for accurate determination of the keying condition also through additional control of the circuit elements for amplitude limiting or for product formation, or even of possibly necessary intermediate amplifiers.

Figure 11:
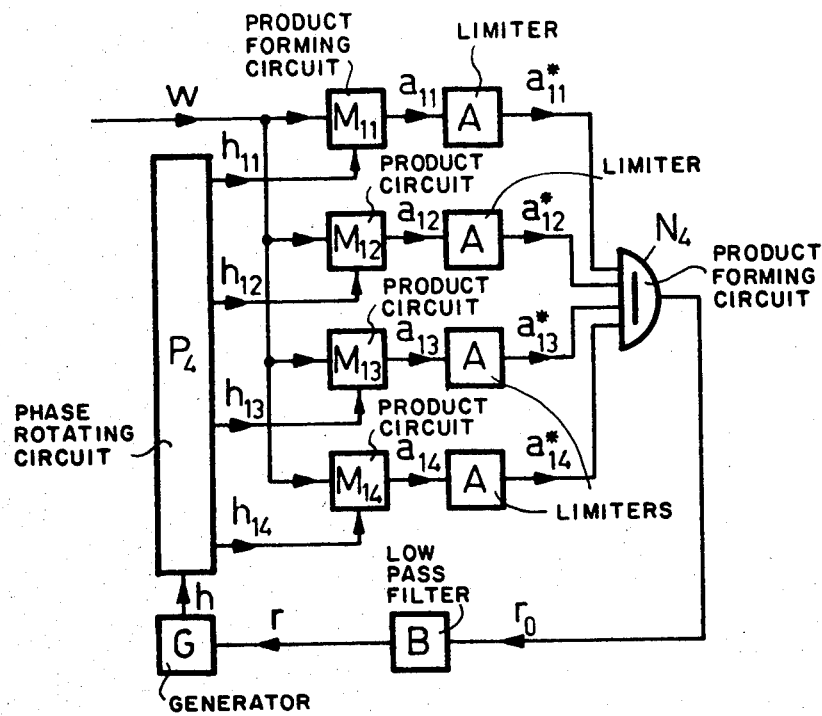
FIG. 11 is a block diagram of another embodiment of the invention.
Figure 12:
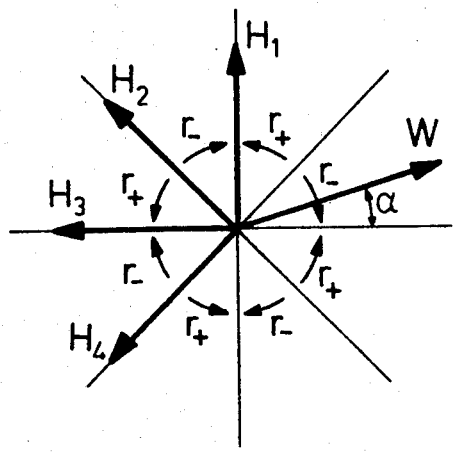
FIG. 12 is a vector diagram illustrating the operation of FIG. 11.

The formation of the products of the signs for deriving the control magnitude in accordance with FIGS. 8, 11, 13 has the advantage, as compared with a derivation of the analog product in accordance with FIGS. 6, 7, of a smaller expense for avoiding the possibilities of errors with badly chosen or badly matched circuit elements (product circuits $M_3$, $M_4$, squaring circuits $Q_1$, $Q_2$). On the other hand the phase-dependent variation of the control signal apparent from FIG. 10 is less advantageous from the point of view of rapid and yet stable regulation than the variation of FIG. 9, where for small phase errors the control signal is proportional to these errors. It is however possible through additional means to attain a suitable variation of the control signal even in accordance with the inversion method, so that the control-technological disadvantages may be avoided. By random frequency wobbling of the generator G, auxiliary oscillations h may be generated that yield alternating small shifts of the control voltage crossings of FIG. 10, so that for small phase errors $\alpha$ the smoothed control voltage finally varies in proportion to these errors. Such arrangements are however somewhat less suited to simultaneous demodulation of the phase-keyed signals, since the range of permissible phase error of the received signals diminishes in accordance with the additional phase variation of the auxiliary signals.

Figure 18:
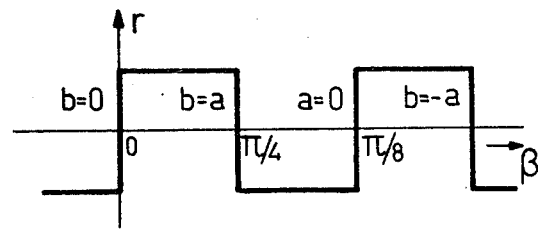
FIGS. 18 and 19 show alternative waveforms of control signals derived by the use of the invention and FIGS. 20 and 21 illustrate modifications that may be incorporated in embodiments of the invention.
Figure 19:
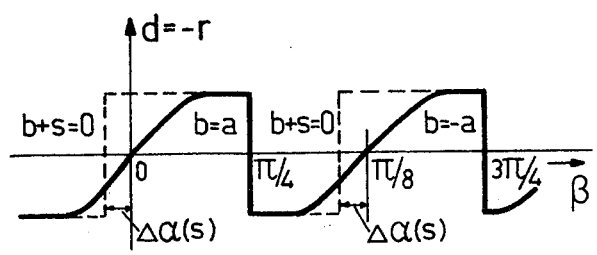

An effective correction of the control magnitude is on the other hand possible, with avoidance of the explained disadvantages, through the employment of additional signals s, which are applied to the demodulation signals a and b before their limiting. In the circuit of FIG. 8 a signal s continuously variable within definite limits is introduced so that the zero crossings of (a + s) and (b + s) shift by small amounts as compared with the original positions. While without the employment of these additional signals the control magnitude exhibits the variation of FIG. 18, there now results, in accordance with each instantaneous value of the additional signal, the variation of the unsmoothed output signal $r_o$ of N, shown for example in broken line fashion in FIG. 19. For continuously variable additional signals the smoothed control magnitude r is on the other hand assumed as the mean value of different square-wave signals, for example the variation shown in FIG. 19, which is proportional to small phase errors.

The introduction of an additional signal to obtain a curved control characteristic with limited product signals is also possible in the remaining circuit embodiments. Thus in the circuit of FIG. 11 the limited signals $a_{11}^*$ and $a_{13}^*$ or even the signals $a_{12}^*$ and $a_{14}^*$ may be supplemented by the addition of additional signals. In the explained operation with only two keying conditions with omission of the product forming circuits $M_{12}$ and $M_{14}$ (FIG. 11) on the other hand addition of the additional signal to the limited signal $a_{11}^*$ is sufficient.

The additional signal s, as dependent upon time t, may have the variation shown in FIG. 15a (i.e., a periodic and symmetrical sawtooth voltage), so that each zero crossing of $r_0$ is followed by the corresponding amount $\Delta \gamma$ s. With this variation, all the instantaneous values of s are equally probable, so that even the additional angular displacements within the limits $\pm \Delta \gamma$ s appear with the same probability $p(\Delta \alpha)$ in accordance with FIG. 15b. The control signal, that follows the integral value of the probabilities, thus has a variation in accordance with FIG. 15c. A further advantageous variation is produced by the use of additional signals in accordance with FIG. 16a, which yields a probability distribution of the zero-crossing displacements e.g. in accordance with the bell curve of FIG. 16b, so that finally through integration a variation of the smoothed control magnitude in accordance with phase error as shown in FIG. 16c results. It is also possible, however, to use additional signals with the character of noise in accordance with FIG. 17a, of which the individual values behave in accordance with the probability distribution of FIG. 17b with preference for small values. Here also there is finally derived a control voltage with a variation of s-form in accordance with FIG. 17c. For the unstable zero-crossings ($\beta = \pi/4, 3\pi/4, \ldots$) a curvature of the characteristic is in general undesirable, since these already small phase deviations should yield the largest possible control voltages, so that the adjacent stable zero-crossing is reached in the shortest time. To produce a curvature of the characteristic for the phases $\pi/4$, $3\pi/4$, the addition of further signals to the sum signal (a + b) and to the difference signal (b − a) in the circuit of FIG. 8 is sufficient. These measures are particularly advantageous with interchange of the stable and unstable zero crossings by inversion of the control voltage, as is explained with reference to Tables III and IV set forth hereinabove.

Figure 20:
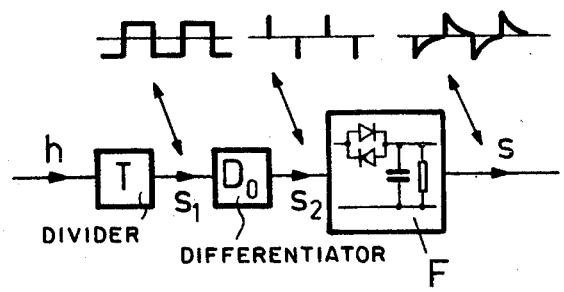

The variation of the additional signal with emphasis for small amplitudes shown in FIG. 16a is produced by generating this signal with a circuit in accordance with FIG. 20. By frequency division in a divider T of an auxiliary signal h taken from the generator G, there first results the square-wave signal $S_1$. By differentiation in $D_0$ there results therefrom the signal $S_2$ consisting of impulses. A circuit F for forming the additional signal s contains a capacitor that is positively or negatively charged by the impulses through the rectifier indicated, followed by a discharge through the parallel resistance.

Figure 21:
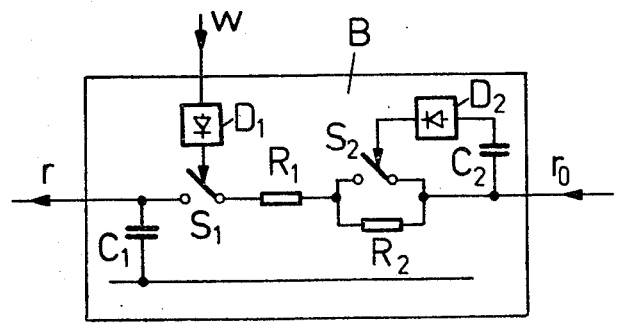

The low-pass filter B employed in FIGS. 7, 8, 11 and 13 for smoothing the control voltage r serves to equalize the effect of brief disturbances and the avoidance of stability problems occasioned by too-small time constants. Such a filter can, for example, be constructed in accordance with FIG. 21 by a parallel capacitor $C_1$ in combination with a series resistor $R_1$.

With transient interruption of the transmission, the control voltage existing at the time should be maintained, in order to avoid new synchronization after the interruption. For this reason there is derived from the high frequency signals w by means of the rectifier $D_1$ a control signal for actuating the switch $S_1$, through which, upon failure of this oscillation, the lead to the capacitor $C_1$ is interrupted so that the charge condition thereof is maintained. At the beginning of synchronization, smoothing of the control voltage with small time constants is advisable for initial stages of the synchronizing process in cases of initially large phase deviations. By short circuiting the series resistance $R_2$ with the switch $S_2$ such a diminution of the time constant is possible. To obtain a control voltage for actuating the switch, the still unfiltered control signal $r_0$, is freed from the direct current components by the capacitor $C_2$, while the alternating components still present at the beginning of the regulation process are rectified in $D_2$. After removal of the initial frequency difference between the auxiliary signals h of the generator G and the received signals w, large fluctuations of $r_0$ vanish, so that the control voltage of the switch $S_2$ also vanishes. The opening of the switch which then occurs, effects an increase of the series resistance by the resistance value of $R_2$ and thus a corresponding increase in the filter time-constant.

The figures shown in the drawings are naturally to be regarded only as exemplary embodiments for effecting synchronization in the reception of phase-keyed signals in accordance with the invention. Self-evidently by the use of known means and taking account of present-day technical knowledge, many other embodiments may be obtained, in which the invention as defined by the claims is likewise made use of.

What is claimed is:

1. A demodulator for a phase keyed carrier comprising:
    means for providing first and second frequency signals having a substantially constant phase difference therebetween;
    first means for mixing the modulated carrier with one of said first and second signals;
    second means for mixing the modulated carrier with the remaining one of said first and second frequency signal;
    means for combining the outputs of said first and second mixers for generating a control signal coupled to said providing means for regulating at least one of said first and second frequency signals product-forming means for forming the products of the outputs of said first and second mixer means; said means for combining further including a sum-forming circuit coupled between said first and second mixers and said combining means and a difference-forming circuit coupled between said first and second mixers and said combining means to respectively couple the sums and the differences of the mixer outputs to said product-forming means.

2. Apparatus for the demodulation of a phase-keyed high frequency signal w comprising, in combination:
    variable frequency means for producing first and second auxiliary high frequency signals $h_1$ and $h_2$;
    phase-shift means connected to said variable frequency means for producing a phase shift between said first and second signals $h_1$ and $h_2$;
    first and second mixer circuit means each receiving, as inputs, said high frequency signal w and said auxiliary high frequency signals $h_1$ and $h_2$ respectively, and producing output signals a and b respectively;

product forming circuit means for producing a control signal r having a value related to a b·($b^2$-$a^2$);

and means connecting said control signal r to said variable frequency means and varying the output frequencies $h_1$ and $h_2$ in accordance with said control signal r.

3. Apparatus in accordance with claim 2 wherein the output signals of the mixers are applied to the product forming circuit on the one hand directly and on the other hand by way of at least one sum-forming circuit and by way of at least one difference-forming circuit.

4. Apparatus in accordance with claim 2 wherein the input signals applied to the product forming circuit are limited in amplitude.

5. Apparatus in accordance with claim 2 wherein the product-forming circuit is comprised of a switching circuit, the constant amplitude output signal of which has a sign corresponding to the product of the signs of the input signals.

6. Apparatus in accordance with claim 2 wherein the output signal of the product-forming circuit is applied to a low-pass filter for the suppression of rapid fluctuations and the output signal of this filter is applied to control the generator frequency.

7. The method of demodulating a phase-keyed high frequency signal w having a given number n of possible keying conditions, comprising the steps of:

producing at least first and second auxiliary high frequency signals $h_1$ and $h_2$, respectively, having the same frequency and having a constant phase difference;

mixing said phase-keyed high frequency signal w with said first and second high frequency signals respectively to produce respective difference frequency signals a and b;

producing an output control signal r for controlling the frequency of said first and second auxiliary high frequency signals $h_1$ and $h_2$ by producing, from the vector voltage $V_k$ of the signal, its involute $V_k^n$, and deriving said control signal from one component of said involute vector $V_k^n$;

and varying said frequency of said signals $h_1$ and $h_2$ in accordance with the variation of said output control signal r.

8. The method of claim 7 wherein said signals a and b are phase-shifted from one another by 90°.

9. The method of claim 8 wherein said control signal r follows the form of a b ($b^2$ − $a^2$).

10. The method of claim 9 wherein said control signal r is produced by circuit means for producing the difference (b−a) and the sum (b+a) and by producing the product of a b (b−a)(b+a).

11. The method of claim 9 which includes the steps of squaring the signals a and b respectively, and then taking the difference of ($b^2$-$a^2$) and multiplying said difference by the product of a and b.

12. The method in accordance with claim 9 wherein from said signals a and b there are derived the sum signal (b + a) and the difference signal (b − a) and to form the control signal the product of a, b, (b+a) and (b−a) is produced.

13. The method in accordance with claim 8 wherein from signals a and b there are derived the sum signals (b +$\sqrt{3}$ a), ($\sqrt{3}$ b + a) and also the difference signals (b −3$\sqrt{}$a), ($\sqrt{3}$ b − a) and to form the control signal the product of the signals a, b and these sum and difference signals are produced.

14. The method in accordance with claim 8 wherein from said signals a and b there are derived the sum signals (b + a), [b + ($\sqrt{2}$ + a)a], [b + $\sqrt{2}$ − 1)a] and also the difference signals (b − a), [b − ($\sqrt{2}$ + 1)a], [b − ($\sqrt{2}$ − 1) a] and the control signals is formed by the product of the signals a, b and these sum and difference signals are produced.

15. The method in accordance with claim 7 wherein at least three further signals are derived by mixing the phase keyed high frequency oscillation with at least three auxiliary oscillations of unlike phase, the control signal being produced by forming the product of said further signals.

16. The method in accordance with claim 15 wherein three said further signals are derived by mixing the phase keyed high frequency oscillation with three auxiliary oscillations differing in phase by $\pi/3$ or integral multiples thereof.

17. The method in accordance with claim 15 wherein four said further signals are derived by mixing the phase keyed high frequency oscillation with four auxiliary oscillations differing in phase by $\pi/4$ or integral multiples thereof.

18. The method in accordance with claim 15 wherein six said further signals are derived by mixing the phase keyed high frequency oscillation with six auxiliary oscillations differing in phase by $\pi/6$ or integral multiples thereof.

19. The method in accordance with claim 15 wherein eight said further signals are derived by mixing the phase keyed high frequency oscillation with eight auxiliary oscillations differing in phase by $\pi/8$ or integral multiples thereof.

20. The method in accordance with claim 15 wherein n said further signals are derived by mixing the phase keyed high frequency oscillation with n auxiliary oscillations differing in phase by $\pi/n$ or integral multiples thereof, where n = 2, 3, 4, . . . ,n.

21. The method in accordance with claim 7 wherein said output control signal r consists of a signal of constant amplitude of which the sign varies in accordance with the product of the signs of the signals a and b.

22. The method in accordance with claim 7 wherein said signals a and b and the signals formed therefrom are amplitude limited before being used for product formation.

23. The method in accordance with claim 15 wherein said further signals are amplitude limited before being processed for product formation.

24. The method in accordance with claim 7 wherein there are derived by mixing the phase keyed oscillation with two mutually orthogonal auxiliary oscillations two further signals from which a control signal controlling the frequency of the auxiliary oscillations is obtained by limiting and product formation.

25. The method in accordance with claim 22 wherein the auxiliary oscillations mixed with the phase keyed high frequency oscillation are additionally wobbled in phase.

26. The method in accordance with claim 22 wherein at least selected ones of the amplitude limited signals are varied before being processed for product formation by the addition of variable additional signals.

27. The method in accordance with claim 24 wherein the variable additional signal comprises a noise signal.

28. The method in accordance with claim 21 wherein the variable additional signal comprises a periodic squarewave signal.

29. The method in accordance with claim 20 wherein the variable additional signal comprises a periodic and symmetrical sawtooth signal.

30. The method in accordance with claim 7 wherein the control signal is smoothed by a low-pass filter before being applied for frequency control of the auxiliary signals.

31. The method in accordance with claim 30 wherein a further control signal derived by rectification of the phase keyed high frequency oscillation is applied to produce an increase in the filter time-constant with diminishing amplitude of the high-frequency oscillation.

32. The method in accordance with claim 29 wherein there is derived by rectification of the control signal freed from direct-current components a further control signal which in response to diminishing amplitude of the control signal fluctuations increases the time constant of the subsequent smoothing.

33. The method in accordance with claim 7 wherein the phase evaluation is interrupted during the transitions between the individual keyed conditions.

34. The method in accordance with claim 7 wherein the control signal derived by product formation is interrupted during the transitions between the individual keyed conditions.

* * * * *